(12) United States Patent
Radun

(10) Patent No.: US 11,506,700 B2
(45) Date of Patent: Nov. 22, 2022

(54) POWER MANAGEMENT AND STATE DETECTION SYSTEM

(71) Applicant: GE AVIATION SYSTEMS LLC, Grand Rapids, MI (US)

(72) Inventor: Arthur Vorwerk Radun, Mason, OH (US)

(73) Assignee: GE Aviation Systems LLC, Grand Rapids, MI (US)

( * ) Notice: Subject to any disclaimer, the term of this patent is extended or adjusted under 35 U.S.C. 154(b) by 148 days.

(21) Appl. No.: 16/811,227

(22) Filed: Mar. 6, 2020

(65) Prior Publication Data

US 2020/0259322 A1    Aug. 13, 2020

Related U.S. Application Data

(63) Continuation of application No. 15/605,364, filed on May 25, 2017, now Pat. No. 10,601,218.

(51) Int. Cl.
| | | |
|---|---|---|
| G01R 31/00 | (2006.01) | |
| H02H 3/20 | (2006.01) | |
| G05B 23/02 | (2006.01) | |
| G05B 19/042 | (2006.01) | |
| H02H 7/26 | (2006.01) | |
| H04L 67/125 | (2022.01) | |
| H02H 3/04 | (2006.01) | |
| H02H 3/24 | (2006.01) | |
| G01R 19/165 | (2006.01) | |
| G01R 31/50 | (2020.01) | |

(52) U.S. Cl.
CPC ....... *G01R 31/008* (2013.01); *G05B 19/0428* (2013.01); *G05B 23/0264* (2013.01); *G05B 23/0283* (2013.01); *H02H 3/207* (2013.01); *H02H 7/263* (2013.01); *G01R 19/16538* (2013.01); *G01R 31/50* (2020.01); *H02H 3/04* (2013.01); *H02H 3/24* (2013.01); *H04L 67/125* (2013.01)

(58) Field of Classification Search
CPC .. G01R 31/008; G05B 19/0428; H02H 3/207; H02H 7/263
See application file for complete search history.

(56) References Cited

U.S. PATENT DOCUMENTS

| | | |
|---|---|---|
| 4,414,539 A | 11/1983 | Armer |
| 4,943,919 A | 7/1990 | Aslin et al. |
| 7,509,537 B1 | 3/2009 | Jensen et al. |
| 8,135,552 B2 | 3/2012 | Hays et al. |
| 8,560,160 B2 | 10/2013 | Holzer |
| 9,137,038 B1 | 9/2015 | Mazuk et al. |
| 9,387,935 B2 | 7/2016 | Todd et al. |
| 9,521,374 B1 | 12/2016 | Runge |
| 9,550,583 B2 | 1/2017 | Szeto |

(Continued)

FOREIGN PATENT DOCUMENTS

| | | |
|---|---|---|
| CN | 101421593 A | 4/2009 |
| CN | 103109434 A | 5/2013 |

*Primary Examiner* — Scott Bauer
(74) *Attorney, Agent, or Firm* — McGarry Bair PC

(57) ABSTRACT

A power distribution system and method can include a controller and a set of power-using devices. Each power-using device in the set can include a sensor configured to measure a parameter and transmit a sensor signal representing the parameter to the controller, and the controller can respond to the transmitted sensor signal.

13 Claims, 3 Drawing Sheets

(56) References Cited

U.S. PATENT DOCUMENTS

| | | | |
|---|---|---|---|
| 2010/0072352 A1* | 3/2010 | Kesler | H02H 1/0023 250/216 |
| 2012/0139550 A1* | 6/2012 | Gillis | H02H 1/0023 324/501 |
| 2015/0096359 A1 | 4/2015 | Catt | |
| 2015/0098161 A1* | 4/2015 | Horowy | H02H 9/02 361/87 |
| 2016/0352091 A1 | 12/2016 | Qi et al. | |
| 2016/0362197 A1 | 12/2016 | Chippar et al. | |

* cited by examiner

POWER MANAGEMENT AND STATE DETECTION SYSTEM

CROSS-REFERENCE TO RELATED APPLICATION(S)

This application is a continuation of U.S. application Ser. No. 15/605,364, filed May 25, 2017, now granted as U.S. Pat. No. 10,601,218 on Mar. 24, 2020, which is incorporated herein by reference in its entirety.

TECHNICAL FIELD

The disclosure generally relates to state detection in a power distribution system, and more specifically to the determination of a state of a power-using device in the system.

BACKGROUND

Commercial aircraft typically include an electrical power distribution system which can distribute electricity to loads on the aircraft and protect wires and loads from hazards. It can be beneficial to detect the condition of loads on the aircraft as well as any electrical faults that may occur within the loads, and the power distribution system can route the most appropriate power source to each load as a result of the detected signals.

BRIEF DESCRIPTION

In one aspect, the disclosure relates to a method of operating a power distribution system. The method includes sensing, by a sensor, a presence of light internally within a power-using device in the power distribution system, transmitting, by the sensor, a sensor signal indicative of the presence of light to a controller in the power distribution system, determining, by the controller, one of a fault within the power-using device, a need for maintenance of the power-using device, or a need for adjustment of environmental conditions associated with the power-using device, based on the sensor signal, and responding, by the controller, to the one of the fault, the need for maintenance, or the need for adjustment of environmental conditions by contemporaneously transmitting a controller signal indicative of the one of the fault, the need for maintenance, or the need for adjustment of environmental conditions.

In another aspect, the disclosure relates to a method of indicating a state of a power-using device in a direct current (DC) power distribution system. The method includes detecting, by a sensor, a parameter associated with light in the power-using device, defining a sensor signal, transmitting the sensor signal to a controller, determining, by the controller, a state of the power-using device based on the sensor signal, and transmitting a controller signal indicative of the state.

In yet another aspect, the disclosure relates to a direct current (DC) power distribution system including at least one power-using device, a sensor within the at least one power-using device and configured to transmit a sensor signal indicative of a presence of light, and a controller electrically connected to the sensor and configured to determine a state of the at least one power-using device based on the transmitted sensor signal, and controllably operate the at least one power-using device based on the determined state.

DETAILED DESCRIPTION

Figure 1:
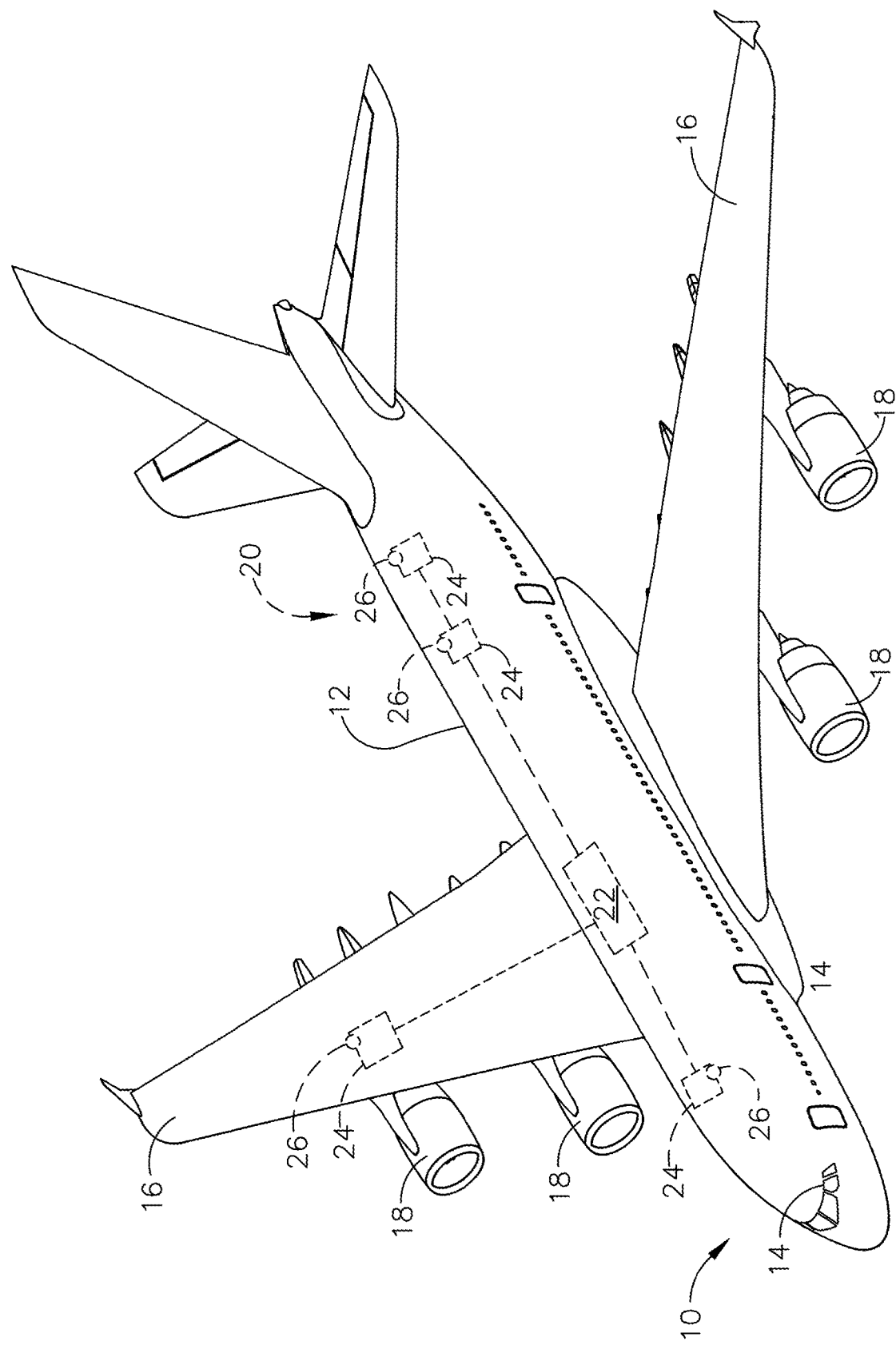
FIG. 1 is a schematic perspective diagram of an aircraft including a power management and distribution system (PMDS) according to various aspects described herein.

The described aspects of the present disclosure are directed to a power management system. For purposes of illustration, the present disclosure will be described with respect to an aircraft power distribution system. It will be understood, however, that the disclosure is not so limited and can have general applicability in non-aircraft applications, such as solar power distribution systems, electric vehicles, trains, or ships, in non-limiting examples.

As used herein "a set" can include any number of the respectively described elements, including only one element. Additionally, all directional references (e.g., radial, axial, proximal, distal, upper, lower, upward, downward, left, right, lateral, front, back, top, bottom, above, below, vertical, horizontal, clockwise, counterclockwise, upstream, downstream, aft, etc.) are only used for identification purposes to aid the reader's understanding of the present disclosure, and do not create limitations, particularly as to the position, orientation, or use of the present disclosure. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 illustrates an aircraft 10 which can also include a fuselage 12, a cockpit 14 positioned in the fuselage 12, and wing assemblies 16 extending outward from the fuselage 12. The aircraft 10 can also include multiple engines, including turbine engines 18 which by way of non-limiting example can be turbojet engines, turbofan engines, or turboprop engines. While a commercial aircraft 10 has been illustrated, it is contemplated that aspects of the disclosure described herein can be used in any type of aircraft. Further, while two turbine engines 18 have been illustrated on each of the wing assemblies 16, it will be understood that any number of turbine engines 18 including a single turbine engine 18 on the wing assemblies 16, or even a single turbine engine 18 mounted in the fuselage 12 can be included.

A DC power distribution system, also known as a power management and distribution system (PMDS) 20 is illustrated in phantom. The PMDS 20 can include a controller 22, which can be an intelligent controller 22 capable of receiving signals and producing indications or decisions based on those signals, as well as a set of power-using devices 24, referred to herein as "line replaceable units" (LRUs) 24 and which can include power generators, power switches, or loads in non-limiting examples. Each LRU 24 has a sensor 26 that is capable of detecting a parameter in the LRU associated with voltage, current, temperature, or light; it will be understood that as used herein, "detecting voltage" or "measuring voltage" can also refer to "detecting a parameter associated with voltage," and that the same applies to the detection of current, temperature, and light. Furthermore, "light" as used herein can refer to electromagnetic radiation having wavelengths in the visible or ultraviolet range.

Each sensor in the set of sensors 26 can be connected to the controller 22. It is contemplated that fiber optic cables can be used to connect the sensors 26 to the controller 22; however, the disclosure is not so limited and traditional materials such as copper wire can also be used.

It is contemplated that a given sensor 26 can be positioned internally within, or external to, its corresponding LRU 24. It is further contemplated that a single LRU 24 can have multiple sensors 26, or that a single sensor 26 can be capable of detecting multiple parameters. It should be understood that the present disclosure could also be applied to other unit arrangements for different aircraft engine arrangements, and that the exemplary power management and distribution system 20 is for illustrative purposes only and not meant to be limiting.

Figure 2:
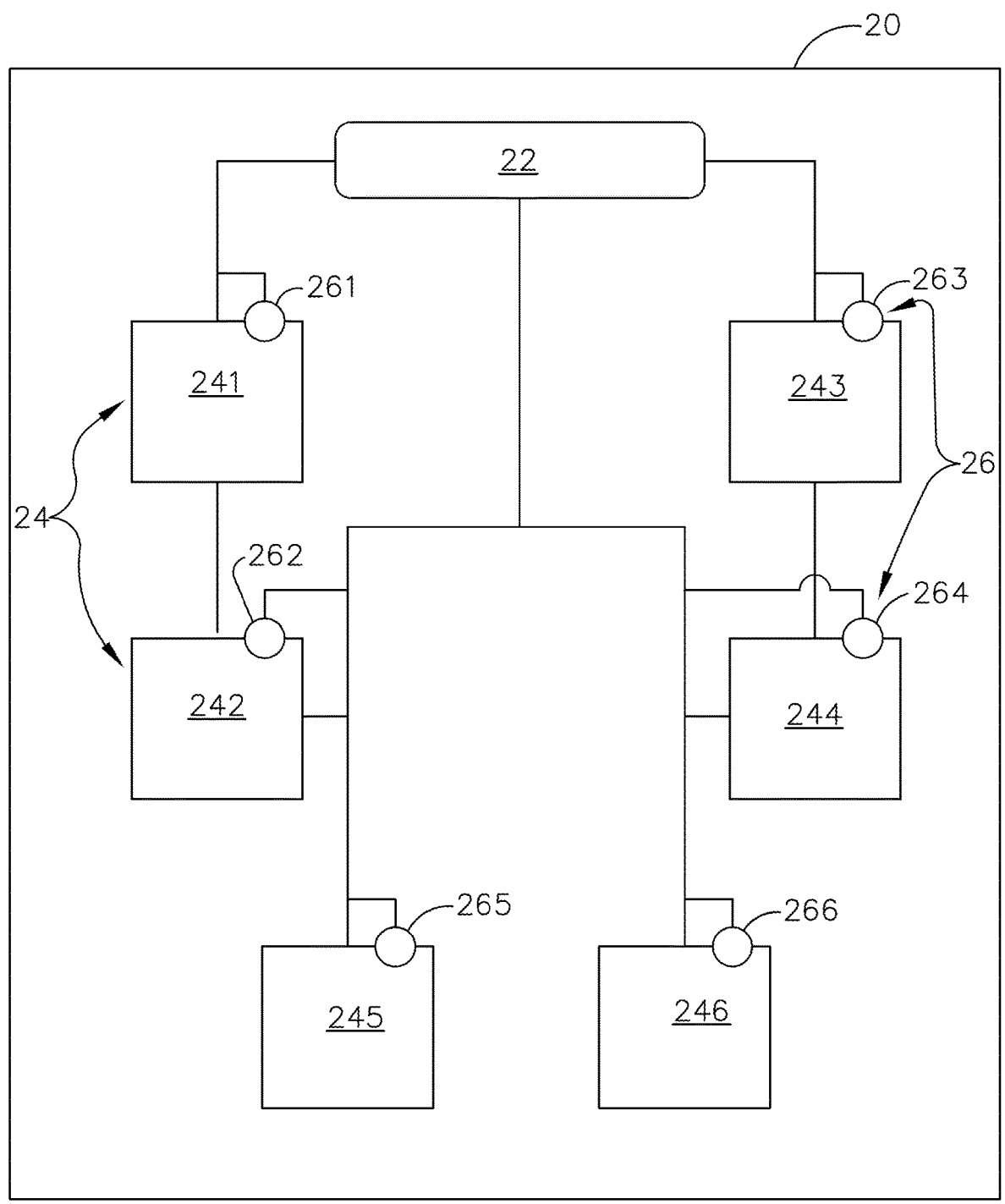
FIG. 2 illustrates a schematic view of the PMDS of FIG. 1.

The PMDS 20 is illustrated in further detail in FIG. 2. A first LRU 241 having a first sensor 261 and a second LRU 242 having a second sensor 262 are included in the PMDS 20, where the sensors 261, 262 are configured to measure voltage. The PMDS 20 also can include a third LRU 243 having a third sensor 263, a fourth LRU 244 having a fourth sensor 264, a fifth LRU 245 having a fifth sensor 265, and a sixth LRU 246 having a sixth sensor 266, where the third and fourth sensors 243, 244 are configured to measure current, the fifth sensor 245 is configured to measure temperature, and the sixth sensor 246 is configured to detect light.

In operation, the sensors 26 can transmit sensor signals in real time to the controller 22 representing their measured or detected parameter. In one example, the first and second sensors 261, 262 can transmit sensor signals to the controller 22 indicating the voltage across the first and second LRUs 241, 242, respectively. The controller 22 can compute the difference between the two voltages and compare this difference with a pre-determined threshold value such as 15V in a non-limiting example. If the voltage difference between the first and second LRUs 241, 242 exceeds the threshold value, the controller can send a controller signal to indicate a fault condition such as a series arc fault, and the PMDS 20 can respond in real time to the fault. It is contemplated that the voltage of every LRU 24 in the PMDS 20 can be compared and checked for a fault condition in the manner described above.

It should be understood that the PMDS 20 can be an intelligent PMDS 20 such that it can respond to the controller 22 in a variety of ways, including redirecting current to or away from an LRU 24, increasing or reducing power in an LRU 24, operating an LRU 24, shutting down or rendering inoperable an LRU 24, displaying a visual message, or playing an audio message, in non-limiting examples. In addition, any of the exemplary responses can be performed in real time, be performed once or repeated at pre-determined time intervals, or be combined as desired, in non-limiting examples.

In another example, the third and fourth sensors 263, 264 can transmit sensor signals to the controller 22 indicating the current from the third LRU 243 and the current into the fourth LRU 244, respectively, when the LRUs 243, 244 are connected in series. The controller 22 can compare the two currents, and if they differ by more than a pre-determined threshold value (such as 5% of the total circuit current in a non-limiting example), the controller can send a controller signal indicating a fault condition such as a parallel arc or ground fault, and the PMDS 20 can respond in real time to the fault as described above. It is contemplated that the current out of and into every series-connected LRU 24 in the PMDS 20 can be compared and checked for a fault condition in the manner described above. For multiple LRUs connected to the same node, their currents leaving that node (or entering) can be summed and the sum compared to a determined threshold and checked for a fault condition in the manner described above.

In another example, the fifth sensor 265 can transmit a sensor signal to the controller 22 indicating the temperature of the fifth LRU 245. The controller 22 can compare this temperature with a predicted temperature, and if the difference is above a pre-determined threshold value, the controller can send a controller signal indicating a fault or a need for adjustment of environmental conditions for the fifth LRU 245, and the PMDS 20 can respond in real time as appropriate. It is contemplated that the fifth LRU 245 can further include sensors detecting voltage and current, or that the fifth sensor 265 can also be configured to detect voltage and current, such that the voltage and current of the fifth LRU 245 can also be sent to the controller 22 to compute its power consumption and predicted temperature. It is further contemplated that the temperature of every LRU 24 in the PMDS 20 can be measured and checked for a fault or need for maintenance in the manner described above.

In yet another example, the sixth sensor 266 can transmit a sensor signal to the controller 22 indicating the presence of light within the sixth LRU 246. Light can be detected due to the presence of corona, which can occur before or during a fault, or due to exterior light penetrating a case surrounding the sixth LRU 246, in non-limiting examples. The controller 22 can send a controller signal indicative of a fault or a need for maintenance of the sixth LRU 246 based on the sensor signal, and the PMDS 20 can respond in real time as appropriate. The sensor signal can also be integrated over time, where the presence of light can be sensed during a time interval and used to inform maintenance decisions for the sixth LRU 246. It is also contemplated that the controller 22 can predict a future occurrence of a fault not yet present in the sixth LRU 246 in an example where corona precedes the fault, and the PMDS 20 can respond in a manner that can prevent the fault from occurring in the sixth LRU 246. It is further contemplated that the detection of light can be performed, and a fault, future fault, or need for maintenance can be checked, for every LRU 24 in the PMDS 20 in the manner described above.

It will be understood that the examples described herein are not intended to be limiting, that other parameters not explicitly described can be transmitted by the sensors 26 to the controller 22, and that the controller 22 can indicate other conditions not explicitly described based on signals from the sensors 26.

It is further contemplated that the PMDS 20 can respond to a fault or need for maintenance based on an operation stage of the aircraft 10. In one example, an LRU 24 experiencing a fault can be allowed to continue operating if the aircraft is in a particular flight stage (such as take-off or landing), or based on how much power is supplied to the LRU 24.

Figure 3:
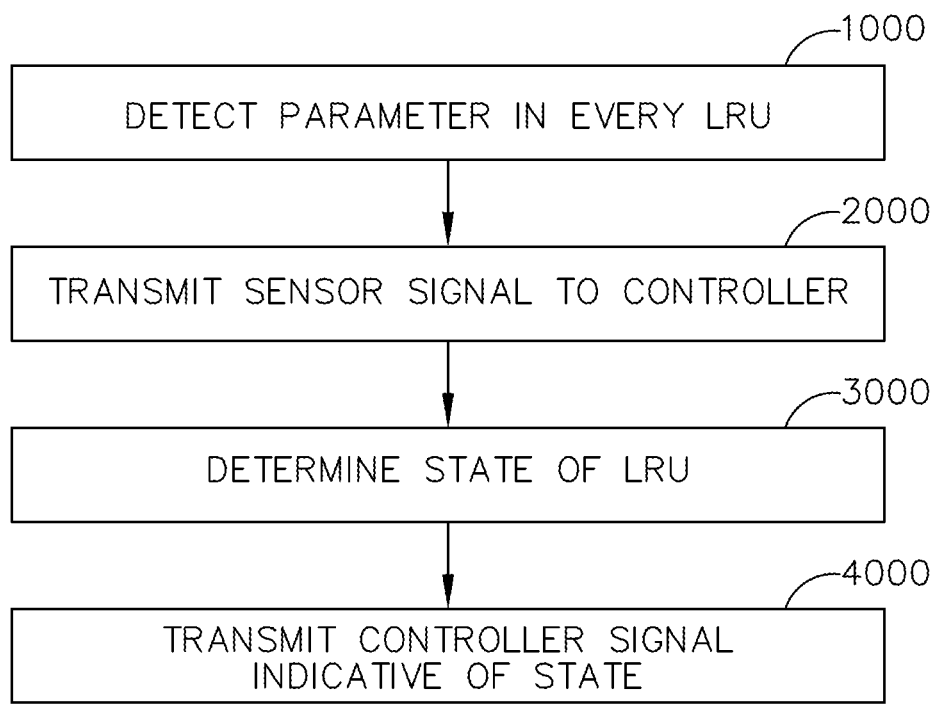
FIG. 3 is a flowchart illustrating a method of evaluating performance of power-using devices in the PMDS of FIG. 1.

A method of indicating a state of an LRU 24 in the PMDS 20 is illustrated in FIG. 3. At 1000, the sensors 26 can detect voltage, current, temperature, or light in every LRU 24. A sensor signal representing the detection can be transmitted to the controller 22 at 2000, and it is contemplated that the signal can be transmitted over fiber optic cables. At 3000 the controller 22 can determine the state of the LRU 24 based on the transmitted sensor signal, such as a fault, a need for maintenance, or a need for adjustment of environmental conditions. It should be understood that the determination of state can be based on comparing voltages between LRUs 24, comparing currents between LRUs 24, evaluating voltages or currents through each LRU 24, comparing a predicted temperature with a detected temperature in an LRU 24, or integrating a detected light signal over time, in non-limiting examples. At step 4000 the controller can transmit a controller signal indicative of the state of the LRU 24.

It can be appreciated that the use of fiber optic cables in the PMDS 20 can provide for improved signal transmission speeds for the sensor signals and real-time responses by the PMDS 20. In addition, connecting every sensor 26 in every LRU 24 to the controller 22 can provide for increased response time to faults, the prevention of faults, or optimized control over LRUs 24 which can increase the efficiency of the PMDS 20 as well as reduce maintenance costs.

To the extent not already described, the different features and structures of the various embodiments can be used in combination, or in substitution with each other as desired. That one feature is not illustrated in all of the embodiments is not meant to be construed that it cannot be so illustrated, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of operating a power distribution system, the method comprising:
   sensing, by a sensor, a presence of voltage within a power-using device in the power distribution system;
   transmitting, by the sensor, a sensor signal indicative of the voltage to a controller in the power distribution system;
   integrating, by the controller, the sensor signal over a period of time;
   determining, by the controller, one of a fault within the power-using device, a need for maintenance of the power-using device, or a need for adjustment of environmental conditions associated with the power-using device, based on the integrated sensor signal, wherein the determining is based on determining a voltage difference between the integrated sensor signal and a detected voltage parameter of another power-using device and comparing the voltage difference with a pre-determined threshold; and
   responding, by the controller, to the one of the fault, the need for maintenance, or the need for adjustment of environmental conditions by contemporaneously transmitting a controller signal indicative of the one of the fault, the need for maintenance, or the need for adjustment of environmental conditions.

2. The method of claim 1 wherein the responding further comprises at least one of redirecting current toward the power-using device, redirecting current away from the power-using device, increasing power to the power-using device, decreasing power to the power-using device, shutting down the power-using device, displaying a visual alert, playing an audio alert, or predicting a future occurrence of a fault in the power-using device.

3. The method of claim 1 wherein the power-using device comprises a set of power-using devices, and wherein the sensing further comprises sensing a presence of light in at least a subset of the set of power-using devices.

4. A direct current (DC) power distribution system comprising:
   at least one power-using device;
   a sensor within the at least one power-using device and configured to transmit a sensor signal indicative of a voltage; and
   a controller electrically connected to the sensor and configured to:
     integrate the sensor signal over a period of time;
     determine a state of the at least one power-using device based on the integrated sensor signal by way of determining a voltage difference between the integrated sensor signal and a detected voltage parameter of another power-using device and comparing the voltage difference with a pre-determined threshold; and
     controllably operate the at least one power-using device based on the determined state.

5. The DC power distribution system of claim 4 wherein the state comprises at least one of: a fault within the at least one power-using device, a need for maintenance of the at least one power-using device, or a need for adjustment of environmental conditions associated with the at least one power-using device.

6. The DC power distribution system of claim 4, further comprising a set of fiber optic cables connecting the controller to the sensor.

7. The DC power distribution system of claim 4, further comprising a second sensor configured to sense a parameter associated with at least one of light, current, or temperature within the at least one power-using device and provide a second sensor signal indicative of the sensed parameter.

8. The DC power distribution system of claim 7 wherein the controller is further configured to determine the state based on the integrated sensor signal and the second sensor signal.

9. The DC power distribution system of claim 4 wherein the at least one power-using device comprises a set of power-using devices, with each of the set of power-using devices is electrically coupled to the controller, and with each of the set of power-using devices having a respective sensor.

10. A method of indicating a state of a power-using device in a direct current (DC) power distribution system, the method comprising:
    detecting, by a sensor, a parameter associated with voltage in the power-using device, defining a sensor signal;
    transmitting the sensor signal to a controller;
    determining, by the controller, a state of the power-using device based on the sensor signal by way of determining a voltage difference between the detected parameter and a detected voltage parameter of another power-using device and comparing the voltage difference with a pre-determined threshold; and transmitting a controller signal indicative of the state.

11. The method of claim 10 wherein the detecting further comprises detecting the parameter associated with a corona, and wherein the determining further comprises determining a fault in the power-using device.

12. The method of claim 10 wherein the detecting further comprises detecting the parameter associated with visible light, and wherein the determining further comprises determining at least one of a fault in the power-using device or a need for maintenance of the power-using device.

13. The method of claim 10 wherein the state further comprises one of a fault in the power-using device, a need for maintenance of the power-using device, or a need for adjustment of environmental conditions associated with the power-using device, and the determining of the state further comprises comparing the integrated sensor signal with a threshold value associated with the one of the fault, the need for maintenance, or the need for adjustment.

\* \* \* \* \*